United States Patent
Benetik et al.

(10) Patent No.: US 7,768,054 B2
(45) Date of Patent: Aug. 3, 2010

(54) SEMICONDUCTOR COMPONENT WITH INTEGRATED CAPACITANCE STRUCTURE AND METHOD FOR FABRICATION THEREOF

(75) Inventors: Thomas Benetik, München (DE); Erwin Ruderer, Markt Schwaben (DE)

(73) Assignee: Infineon Technologies, AG, Munich (DE)

( * ) Notice: Subject to any disclaimer, the term of this patent is extended or adjusted under 35 U.S.C. 154(b) by 433 days.

(21) Appl. No.: 10/512,017

(22) PCT Filed: Mar. 24, 2003

(86) PCT No.: PCT/DE03/00964

§ 371 (c)(1),
(2), (4) Date: Apr. 29, 2005

(87) PCT Pub. No.: WO03/090280

PCT Pub. Date: Oct. 30, 2003

(65) Prior Publication Data

US 2005/0208728 A1    Sep. 22, 2005

(30) Foreign Application Priority Data

Apr. 19, 2002  (DE) ............... 102 17 567

(51) Int. Cl.
*H01L 23/52* (2006.01)
*H01L 23/522* (2006.01)

(52) U.S. Cl. ........ 257/303; 257/296; 257/298; 257/300; 257/301; 257/308; 257/E21.012; 257/E27.048; 438/238; 438/239; 438/242; 438/386; 438/399

(58) Field of Classification Search ............ 257/303, 257/296, 298, 300, 301
See application file for complete search history.

(56) References Cited

U.S. PATENT DOCUMENTS 5,208,725 A    5/1993  Akcasu
5,583,359 A   12/1996  Ng et al.

(Continued)

FOREIGN PATENT DOCUMENTS

DE    198 50 915 C1    11/1998

(Continued)

OTHER PUBLICATIONS

International Search Report for related application, Sep. 18, 2003.

(Continued)

*Primary Examiner*—Zandra Smith
*Assistant Examiner*—Tsz K Chiu
(74) *Attorney, Agent, or Firm*—Brinks Hofer Gilson & Lione

(57) ABSTRACT

A semiconductor component has an insulating layer which is formed on a semiconductor substrate and in which a capacitance structure (K) is formed. The capacitance structure (K) has at least two metallization planes (1 to 7) which are arranged parallel to one another and are each connected to an electrical connecting line. Arranged between the metallization planes (1 to 7) is at least one electrically conductive region (1a to 1j; 2a to 2j; 31a to 36a; 41a to 46a; 5a to 5f) for producing a capacitance surface, the electrically conductive region (1a to 1j; 2a to 2j; 31a to 36a; 41a to 46a; 5a to 5f) being electrically connected only to one of the metallization planes (1 to 7).

29 Claims, 6 Drawing Sheets

U.S. PATENT DOCUMENTS

| | | | |
|---|---|---|---|
| 6,037,621 A | 3/2000 | Wilson | |
| 6,297,524 B1 * | 10/2001 | Vathulya et al. | 257/303 |
| 6,366,443 B1 * | 4/2002 | Devoe et al. | 361/313 |
| 2003/0161091 A1 * | 8/2003 | Devoe et al. | 361/321.2 |

FOREIGN PATENT DOCUMENTS

| | | |
|---|---|---|
| DE | 100 46 910 A1 | 9/2000 |
| JP | 11312855 | 11/1999 |
| WO | WO 01/91144 A1 | 11/2001 |
| WO | WO 01/99163 A2 | 12/2001 |

OTHER PUBLICATIONS

Roberto Aparicio and Ali Hajimiri, "Capacity Limits and Matching Properties of Integrated Capacitors," IEEE Journal of Solid-State Circuits, vol. 37, No. 3, Mar. 2002.

Roberto Aparicio and Ali Hajimiri, "Capacity Limits and Matching Properties of Lateral Flux Integrated Capacitors," To appear in IEEE Custom Integrated Circuits Conference, San Diego, California, May 6-9, 2001.

* cited by examiner

SEMICONDUCTOR COMPONENT WITH INTEGRATED CAPACITANCE STRUCTURE AND METHOD FOR FABRICATION THEREOF

This application claims the priority of International Patent Application PCT/DE03/00964 filed on Mar. 24, 2003, which claims priority to German Patent Application 102 17 567.5 filed on Apr. 19, 2002 and is incorporated herein by reference.

The present invention relates to a semiconductor component with a semiconductor substrate on which an insulating layer is formed, the insulating layer having a capacitance structure formed in it. The invention also relates to a method for fabrication thereof.

Most analog circuit parts of hybrid digital/analog circuits require capacitors having a high capacitance value, a high level of linearity and high quality. In order to keep the costs for fabricating the component as low as possible, it is necessary for the fabrication of the capacitance structures to require as few process steps as possible. In addition, the progressive miniaturization of the components and integrated circuits also entails the demand for as little area requirement as possible for the capacitance structure. A capacitance structure which is known in the prior art is known from patent specification DE 198 50 915 C1. A structure which is in the form of a "sandwich capacitance" has two conductive foils which have been applied to a semiconductor substrate and are isolated from one another by a dielectric layer. The top foil resting on the dielectric layer is connected to at least one of two connecting conductors for the capacitance via at least one conductive air bridge. Parasitic inductances in the capacitance are largely compensated for by virtue of the two connecting conductors being connected to one another by at least one highly resistive line which bridges the capacitance.

Patent specification U.S. Pat. No. 5,583,359 has disclosed a capacitance structure for an integrated circuit. In this case, a plurality of metal plates which form the electrodes of a stack capacitor are arranged above one another, isolated by dielectric layers. Each plane of a metal plate contains a metal line which is insulated from the respective plate. Contact with the metal lines is respectively made from both sides using via connections, as a result of which firstly all plates in odd-numbered positions and secondly all plates in even-numbered positions in the stack are electrically connected to one another. As a result of the plates in even-numbered positions being connected to a first connecting line and the plates in odd-numbered positions being connected to a second connecting line, adjacent plates are at different potentials and form respective pairs of electrodes in a plate capacitor. The capacitance surface is thus formed by the plate surfaces. One alternative embodiment of the electrodes is provided by virtue of the plates being in the form of strip-like lines which are arranged parallel to one another.

A similar embodiment of a capacitance structure is known from patent specification U.S. Pat. No. 5,208,725. A plurality of first lines in strip form are arranged parallel to one another on a semiconductor substrate. A plurality of second lines are arranged congruently on these first lines, isolated by a dielectric layer. As a result of vertically and laterally adjacent lines being at different potentials, both capacitances between lines situated above one another and capacitances between adjacent lines are produced in one plane.

A further capacitance structure is known from Aparicio, R. and Hajimiri, A.: Capacity Limits and Matching Properties of Lateral Flux Integrated Capacitors; IEEE Custom Integrated Circuits Conference, San Diego, May 6-9, 2001. Vertically arranged bar structures are arranged symmetrically with respect to one another. Each of the bars is constructed from metal regions and via regions, which are arranged alternately on one another. The spots of metal on a bar are at a common potential. Spots of metal on adjacent bars are at different potentials. The via regions respectively make contact with two adjacent metal regions on a bar. The capacitance density is limited by the minimum size of the metal regions in the bars. The size of these metal regions is much larger than the size of the via regions in the bars, however, which is down to the fact that the demands placed on masks for fabricating the metal regions are different than those on masks used to fabricate the via regions. On account of the necessary minimum size of the metal regions, the bars likewise have a minimum size, which limits the capacitance density in this capacitance structure for the miniaturization of the components and the reduction in the space requirement for the capacitance structure.

A drawback of capacitance structures processed specifically for one semiconductor component—as is often the case in processes today—is their complex fabrication. Particularly when such a capacitance structure is in the form of a plate capacitor comprising two additional metallization strata which have no further use in the component or in the circuit, fabrication is more difficult and more cost-intensive. In addition, particularly the sandwich capacitance structures have the drawback that they make only very inefficient use of the surface area which they take up on the chip and, measured against the required surface area, provide a relatively low capacitance value for the useful capacitance and, in connection with this, have a relatively large parasitic capacitance component on the semiconductor substrate. This relatively large parasitic capacitance component means that the useful capacitance of the sandwich capacitances can be increased only to a limited extent.

It is therefore an object of the present invention to provide a semiconductor component having an integrated capacitance structure and a method for fabrication thereof, which semiconductor component is easy to produce, and which method can be used to improve the ratio of useful capacitance to parasitic capacitance.

A semiconductor component has a semiconductor substrate on which a layer system comprising one or more insulating layers is arranged. This insulating layer or this insulating layer system has a capacitance structure formed in it. A first part of a capacitance surface on the capacitance structure is formed by parts of the surfaces of at least two metallization planes. The metallization planes are arranged parallel to one another and parallel to the semiconductor substrate and are electrically connected to a respective connecting line.

A fundamental concept of the invention is that the capacitance structure has at least one electrically conductive region which is arranged between the metallization planes and is formed in the insulating layer system. Besides the first capacitance surface region, the capacitance structure therefore has a second capacitance surface region which enlarges the overall capacitance surface. This electrically conductive region is electrically connected only to one of the metallization planes.

As a result, a capacitance structure can be formed which is relatively easy to fabricate and furthermore improves the ratio of useful capacitance in the capacitance structure to parasitic capacitance. A further advantage is provided by virtue of the arrangement of the electrically conductive region virtually not increasing the horizontal surface area requirement of the overall capacitance structure, and hence the ratio of useful capacitance to required chip area also being significantly improved.

In one advantageous configuration of the invention, the electrically conductive region is in the form of a homogeneous, cohesive elevation. It is particularly advantageous if the electrically conductive regions have no such metal areas produced by patterning the metallization planes. As a result, the electrical regions are formed without intermediate metallization regions—which are produced from the patterning of the metallization planes. Particularly a homogeneous via structure is distinguished as being particularly advantageous. This structure of the vias allows, particularly in comparison with the known capacitance structure in Aparicio, R. and Hajimiri, A.: Capacity Limits and Matching Properties of Lateral Flux Integrated Capacitors; IEEE Custom Integrated Circuits Conference, San Diego, May 6-9, 2001, the production of a much smaller structure than the stacked structure disclosed therein comprising intermediate metallization and via regions. Particularly in a "Dual-Damascene" process, homogeneous vias can be formed in one process step, as a result of which these structures can be lined up at high density and the capacitance surface of the electrodes can be significantly enlarged for a virtually constant horizontal surface area requirement. In this case, Dual-Damascene does not involve a plurality of vias (situated above one another) being produced simultaneously, but rather one via metal stratum simultaneously in each case. In modern Dual-Damascene processes, hole or trench structures for the vias and metal tracks which are to be produced are etched in succession and are subsequently filled simultaneously with a metal, for example copper. The patterning, particularly in the dielectric layer of a capacitance structure, in order to produce the vias, which pass completely through the dielectric layer, can be produced using a lithographic step (via lithography). A subsequent via etching step is used to etch the desired via structure into the dielectric layer. In comparison with processes in which the vias passing through the dielectric layer are produced by means of via and metal mask etching (which is used to produce trench regions for metal tracks), this firstly allows a higher level of accuracy for the capacitance to be achieved, since inaccuracies in the alignment of metal masks do not affect the formation of the capacitance in this case. Furthermore, metal masks which are designed for linear shapes do not allow point structures to be produced simultaneously. This is the case because masks which are designed to produce point structures require, on account of the two-dimensional diffraction effects, a much higher exposure intensity for the hole planes in order to form a corresponding structure, which means that hole masks have a firmly prescribed hole size. To produce the point structures, additional inclusion of metal linear holes (slots) would mean that minimum distances for producing the capacitance can be used advantageously only in one dimension. As advantageously explained in the invention, by avoiding the formation of slots it is possible to produce exclusively vias which have minimum distances in both dimensions and which can be used for alternating capacitor surface areas.

It is also advantageous for the electrically conductive region to be arranged essentially at right angles to the metallization planes. This allows the surface of the electrically conductive region to be designed to be as large as possible, and therefore allows the greatest possible contribution to the useful capacitance to be achieved.

In one preferred exemplary embodiment, the two metallization planes are each in the form of homogeneous plates. Each of the two plates is electrically connected to at least one electrically conductive region. Provision may be made for the electrically conductive regions to be in bar form. Provision may also be made for a plurality of first regions which are in bar form to be arranged on the first metallization plane, said regions extending in the direction of the second metallization plane. The bars are arranged at an essentially fixed distance from one another on the first metallization plane. A plurality of second regions which are in bar form are likewise arranged at an essentially fixed distance from one another on the second metallization plane. Advantageously, these second electrically conductive regions which are in bar form extend between the first bar-like regions in the direction of the first metallization plane. The electrically conductive regions of the two metallization planes are thus arranged offset from one another, which means that, viewed in the vertical direction, a first electrically conductive, bar-like region is always opposite the surface of the second metallization plane, and a second electrically conductive, bar-like region is always opposite the surface of the second metallization plane.

It is particularly advantageous to design the first bar-like regions to have a first length $L_1$ and to design the second bar-like regions to have a length $L_2$, the sum of the lengths $L_1$ and $L_2$ being greater than the distance between the two metallization planes. As a result, the first and second bar-like regions are more or less interlocked. This means that regions of the side faces of the first bar-like regions and regions of the side face of the second bar-like regions are opposite one another, as a result of which an additional share for the total capacitance surface is produced and the useful capacitance can be increased.

In a further advantageous exemplary embodiment, the capacitance structure has two metallization planes which both comprise a plurality of lines arranged parallel to one another. The lines which form the first metallization plane are arranged congruently with respect to the lines which form the second metallization plane. Provision may be made for an electrically conductive region to be arranged on each of the lines. It is advantageous for the electrically conductive regions to be in bar form and to be arranged on the lines such that they respectively extend in the direction of the congruently opposing line in the other metallization plane. It is preferable for a plurality of electrically conductive regions which are in bar form to be arranged on each of the first lines at the respective essentially fixed distance from one another. On the second lines, a respective plurality of regions which are in bar form are likewise arranged at an essentially fixed distance from one another. In this case, too, the bar-like regions of the second lines are arranged such that they extend between the bar-like regions of the first lines in the direction of the first lines. Similarly, a more or less interlocking structure for the first and second bar-like regions of the first and second lines can be achieved in this embodiment, too, if the length ratios $L_1$ and $L_2$ are chosen in line with the first embodiment explained above. This allows the same advantages to be attained.

A further preferred embodiment is characterized by two metallization planes the first of which is in the form of a homogeneous plate and the second of which is in the form of a lattice-like structure. At least one electrically conductive region which is in bar form is mounted on the first metallization plane, which is in the form of a homogeneous plate, such that it extends in the direction of the lattice plane. It is particularly advantageous if the bar-like region extends at least partially into one of the cutouts in the lattice structure of the second metallization plane. This allows the capacitance surface to be increased and allows the share of the useful capacitance to be enlarged.

In a further exemplary embodiment, in addition to the two metallization planes of the preceding embodiment a third metallization plane is provided which is likewise in the form of a lattice and is arranged parallel to and at a distance from the first lattice plane on said first lattice plane. The two lattice planes are in contact with one another by means of electrical connections. The at least one bar-like electrically conductive region is in a form such that it projects through a cutout in the first lattice plane and extends at least partially into a cutout in the second lattice plane or in the third metallization plane. This allows a further enlargement of the capacitance surface and of the useful capacitance to be achieved. The surface area requirement of the capacitance structure can be kept almost the same in this case.

A further aspect of the invention considers a method for fabricating a semiconductor component with an integrated capacitance structure. The capacitance structure is formed in an insulating layer, the insulating layer being deposited on a semiconductor substrate. A fundamental concept is that at least two metallization planes which the capacitance structure has have an electrically conductive region formed between them in the insulating layer, said electrically conductive region being connected only to one of the two metallization planes.

It is advantageous that the electrically conductive region is in the form of a homogeneous cohesive elevation, the electrically conductive region being formed without such a metal area which can be produced by patterning a metallization plane.

With particular preference, the electrically conductive region is in the form of a via structure.

The electrically conductive region or the electrically conductive regions can be produced as via structures by virtue of an etching step being used to etch the holes into the insulating layer which are used to produce the vias by subsequently filling them with a conductive material, for example copper or tungsten. Producing the holes without a combination of such an etching step and an etching step for producing metal tracks—whose regions are defined beforehand by metal masks—allows a high capacitance density for the capacitance structure to be achieved.

Advantageous configurations are specified in the subclaims.

A plurality of exemplary embodiments of the invention are explained in more detail with reference to the schematic drawings below, in which.

Figure 1:
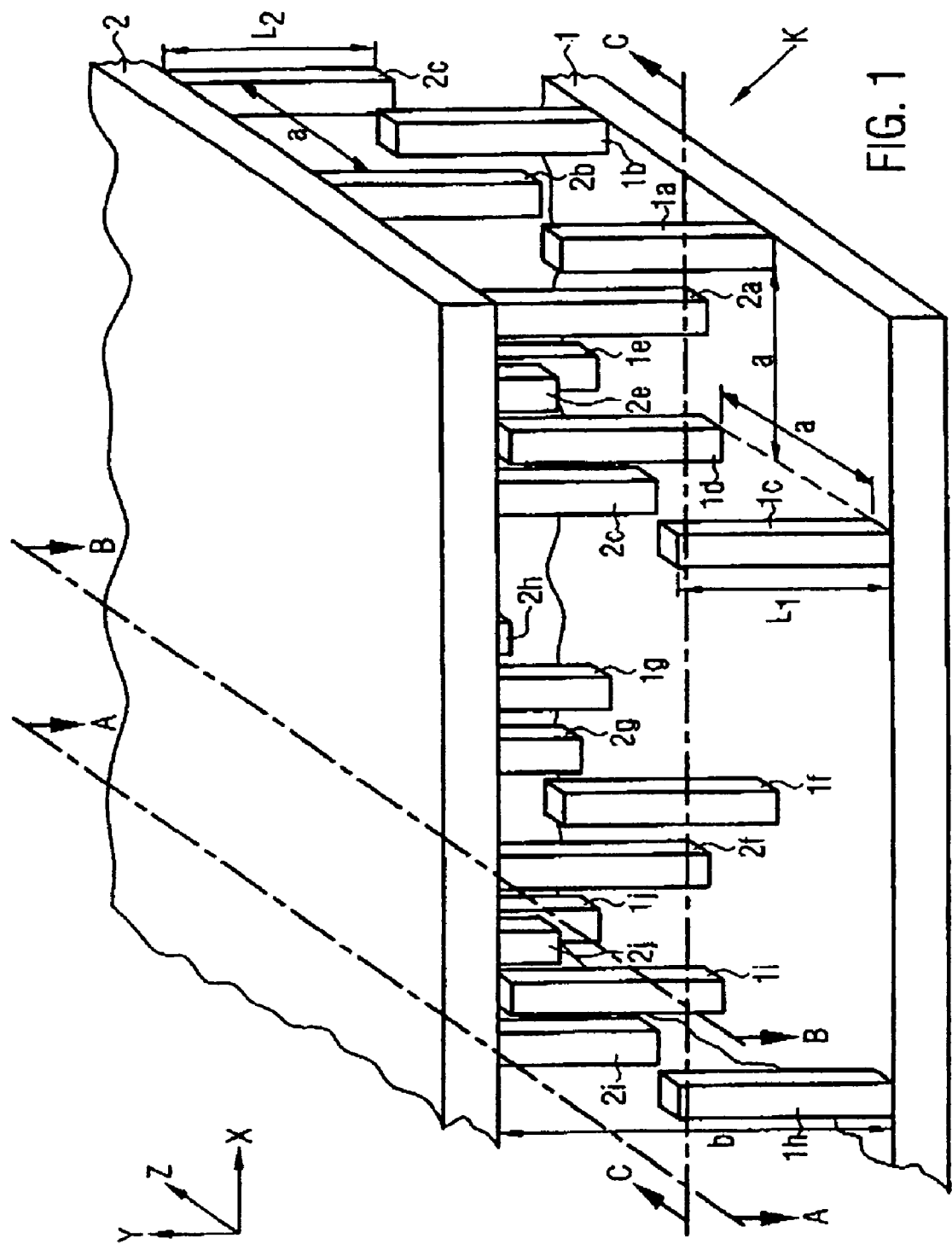
FIG. 1 shows a perspective illustration of a first exemplary embodiment of a semiconductor component based on the invention.

In a first exemplary embodiment, a semiconductor component based on the invention (FIG. 1) has a semiconductor substrate (not shown) on which an insulating layer (not shown) has been applied. The insulating layer may also comprise a plurality of layers. This insulating layer has a capacitance structure K integrated in it. The capacitance structure K has a first metallization plane 1, which is in the form of a homogeneous plate in the exemplary embodiment. Formed parallel to this is a second metallization plane 2, which is likewise in the form of a homogeneous, cohesive plate. The first metallization plane 1 is connected to a first connecting line (not shown) and the second metallization plane is connected to a second connecting line (not shown), as a result of which the two metallization planes 1 and 2 are at different electrical potentials and form electrodes. On the first plate 1, a plurality of electrically conductive regions 1$a$ to 1$j$, which are in bar form, are arranged at right angles to the plate 1. The bar-like regions 1$a$ to 1$j$ are electrically connected directly to the plate 1 and are in the form of homogeneous, cohesive vias with a uniform length $L_1$. The bars 1$a$ to 1$j$ are oriented in the direction of the second metallization plane 2 and are not electrically connected thereto.

In the z direction, the bars 1$a$ and 1$b$, the bars 1$c$, 1$d$ and 1$e$, the bars 1$f$ and 1$g$ and the bars 1$h$, 1$i$ and 1$j$ are respectively arranged at a distance a from one another. In addition, the bars 1$a$, 1$b$, 1$f$ and 1$g$ are respectively shifted by a/2 in the z direction with respect to the bars 1$c$, 1$d$, 1$e$, 1$h$, 1$i$ and 1$j$, so that in the x direction the bars 1$f$ and 1$h$, the bars 1$a$ and 1$f$, the bars 1$d$ and 1$i$, the bars 1$b$ and 1$g$ and the bars 1$e$ and 1$j$ are respectively situated on one line.

Similarly, the plate 2 has second electrically conductive regions 2$a$ to 2$j$ formed on it as homogeneous bars which all have a length $L_2$. The bars 2$a$ to 2$j$ are similarly arranged at the distance a on the plate 2, but are positioned on the plate 2 such that they extend between the bars 1$a$ to 1$j$ in the direction of the first metallization plane 1. Thus, by way of example, the bars 2$a$, 2$b$ and 2$c$ are situated at the same x position as the bars 1$a$ and 1$b$, but are offset from one another in the z direction. The same applies to the other bars 1$c$ to 1$j$ and 2$d$ to 2$j$.

The lengths $L_1$ and $L_2$ of the bars 1$a$ to 2$j$ are chosen such that they are shorter than the distance b between the two metallization planes 1 and 2, but the sum of $L_1$ and $L_2$ is greater than the distance b between the metallization planes 1 and 2. The effect achieved by this is that side face regions of adjacent bars, for example of 1$a$ and 2$a$, are opposite one another and the different electrical potentials which these adjacent bars have creates a capacitance surface whose capacitance contributes a share to the useful capacitance.

Provision may also be made for the bars 1$a$ to 1$j$ and the bars 2$a$ to 2$j$ to have different lengths. The sum of the lengths of adjacent bars on the first and second metallization planes respectively may be greater than the distance b between the metallization planes. This ensures that surface regions of the side faces of the bars 1$a$ to 1$j$ on the first metallization plane 1 and surface regions of the side face of the respectively adjacent bars 2$a$ to 2$j$ on the second metallization plane 2 are always opposite one another and this creates a capacitance surface which makes a contribution to the useful capacitance. In the exemplary embodiment, the plate 2 with the bars 1a to 1j, which is further from the semiconductor substrate, has a minimum parasitic capacitance with respect to the semiconductor substrate.

Figure 2:
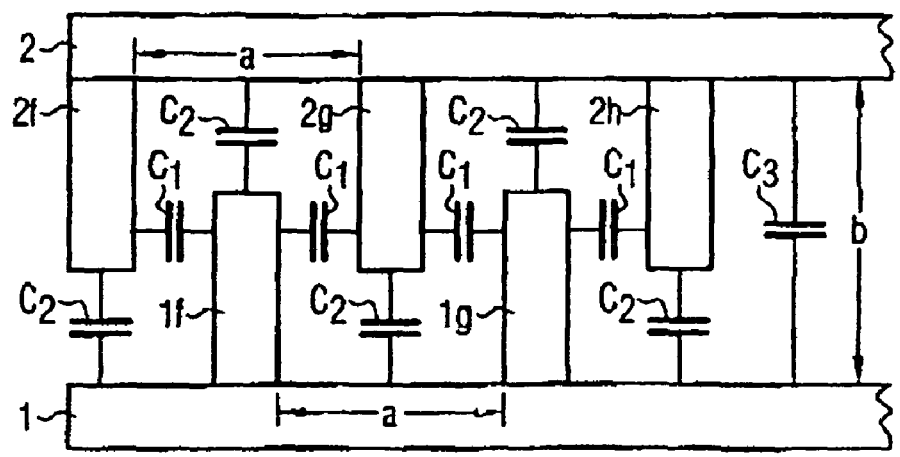
FIG. 2 shows a first sectional illustration of the exemplary embodiment shown in FIG. 1.

FIG. 2 shows a cross section along the line BB from FIG. 1. The plates 1 and 2 have the bars 1f and 1g and 2f to 2h, respectively, which are each at the distance a from one another. In the cross sectional illustration, it is possible to see the more or less interlocking structure of the bars 1f and 1g and bars 2f to 2h which are offset from one another. First capacitance components $C_1$ as a contribution to the total useful capacitance of the capacitance structure K (FIG. 1) are respectively produced between the homogeneous bars 1f, 1g and 2f to 2h, which are in the form of via structures. Second capacitance components $C_2$ as a contribution to the total useful capacitance are produced between the bars 1f and 1g and the plate 1 and also between the bars 2f to 2h and the plate 2. A further capacitance component $C_3$ as a contribution to the useful capacitance is produced by the plate 1 and the plate 2.

Figure 3:
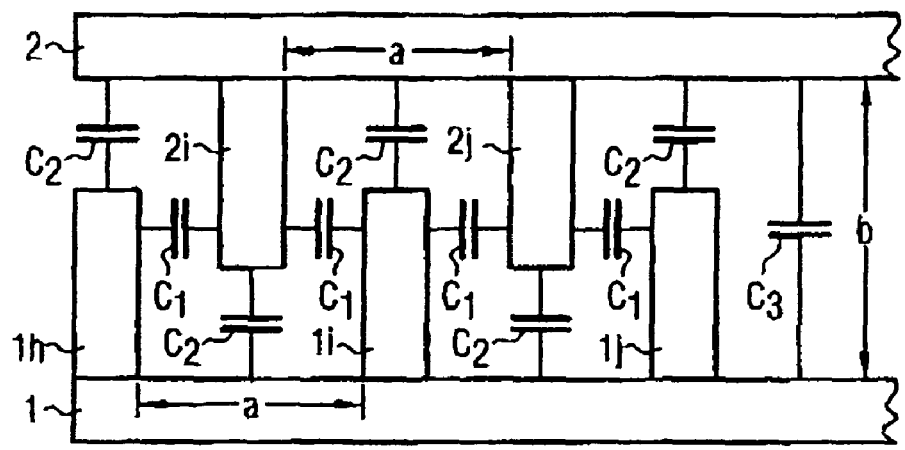
FIG. 3 shows a second sectional illustration of the exemplary embodiment shown in FIG. 1.

FIG. 3 shows a cross sectional illustration of the capacitance structure K from FIG. 1 along the line AA. The contributions of the capacitance components $C_1$, $C_2$ and $C_3$ are produced in line with the statements relating to FIG. 2.

Figure 4:
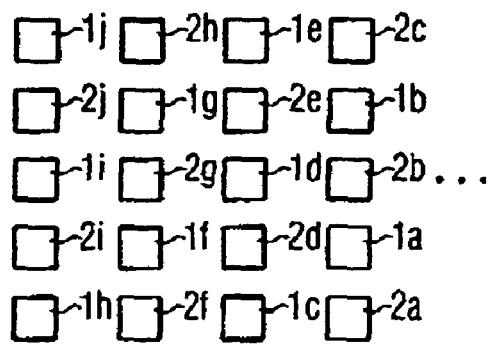
FIG. 4 shows a third sectional illustration of the exemplary embodiment shown in FIG. 1.

A further sectional illustration along the sectional line CC in FIG. 1 is shown in FIG. 4. In this illustration, the symmetrical arrangement of the bars 1a to 1j and of the bars 2a to 2j on the plates 1 and 2 can be seen. Each bar 1a to 1j is adjacent to at least two bars 2a to 2j (similarly each bar 2a to 2j is adjacent to at least two bars 1a to 1j), as a result of which the capacitance components C1 (not shown here) are respectively produced.

Figure 5:
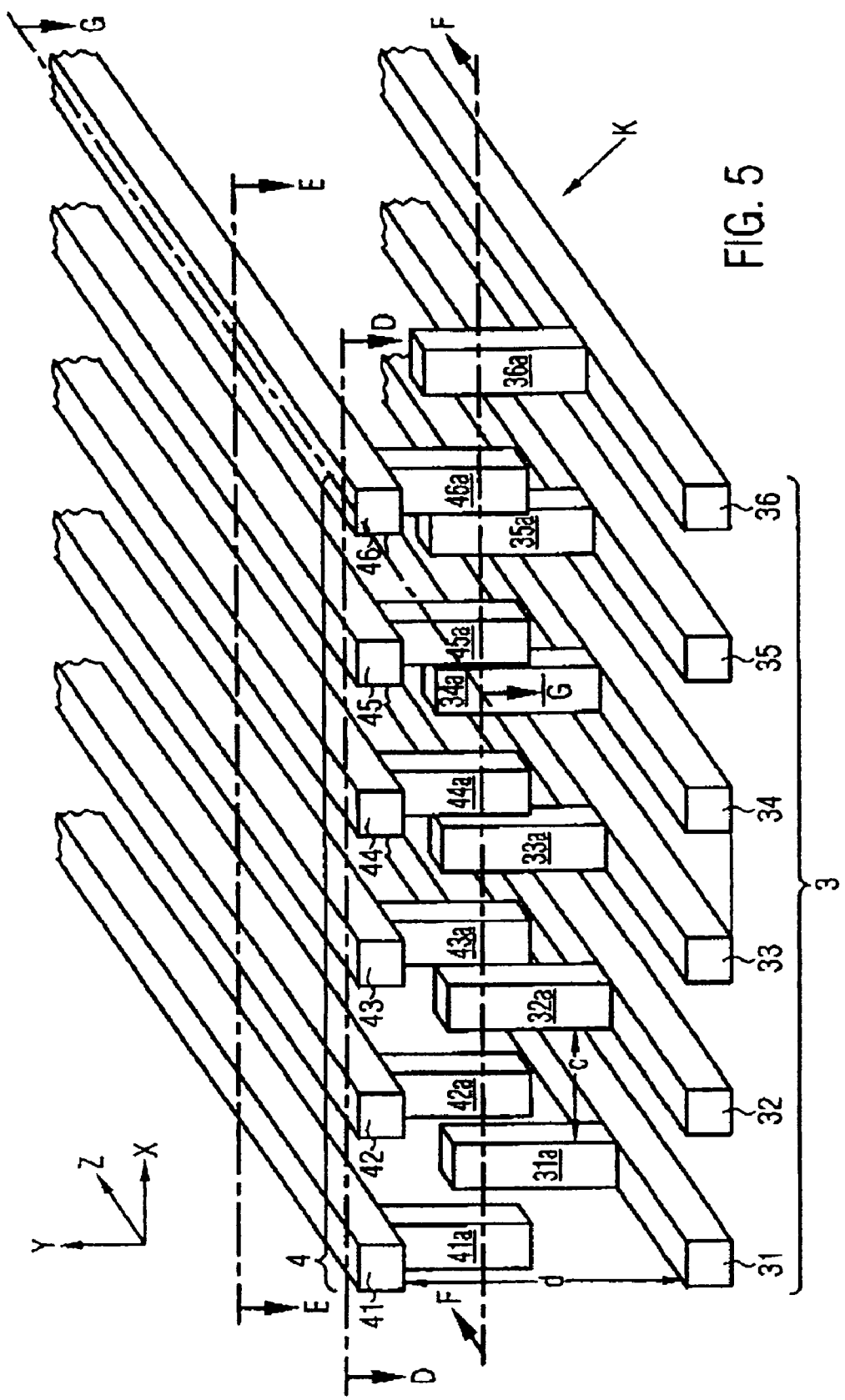
FIG. 5 shows a perspective illustration of a second exemplary embodiment of the inventive semiconductor component.

A further exemplary embodiment is shown in FIG. 5. As in the first exemplary embodiment, the capacitance structure K is formed in an insulating layer (not shown) or in an insulating layer system comprising a plurality of layers, the insulating layer being arranged on a semiconductor substrate (not shown). The metallization planes 3 and 4 are each formed from a plurality of lines 31 to 36 and 41 to 46 arranged parallel to one another, the lines 31 to 36 each being arranged congruently with respect to the lines 41 to 46. The lines 31, 33, 35, 42, 44 and 46 are electrically connected to a first connecting line (not shown), as a result of which these lines are connected to a first potential. The lines 32, 34, 36, 41, 43 and 45 are electrically connected to a second connecting line (not shown), as a result of which these lines are connected to a second potential. On each of the lines 31 to 36 and 41 to 46, a respective homogeneous, electrically conductive region 31a to 36a and 41a to 46a which is in bar form is arranged and is connected directly to the respective line. The bars 31a to 36a are oriented vertically in the direction of the lines 41 to 46. Similarly, the bars 41a to 46a are oriented vertically in the direction of the lines 31 to 36.

The illustration of the bars 31a to 36a and 41a to 46a is exemplary and can be extended in many respects. By way of example, each line 31 to 46 may have a respective plurality of further bars which are arranged, by way of example, at a fixed distance from one another on each line 31 to 46. The bars 31a to 36a are arranged at a fixed first position in the z direction and the bars 41a to 46a are arranged at a fixed second position in the z direction, as a result of which the bars 31a to 36a are arranged offset from the bars 41a to 46a in the z direction. The lengths of the bars 31a to 36a may be uniform or else may be different. Similarly, the bars 41a to 46a may be designed to be of uniform length or to be of different lengths. For this exemplary embodiment, too, it is fundamental that the sum of the length of a bar 31a to 36a plus the length of a bar 41a to 46a is greater than the distance d between the respective lines in the metallization planes 3 and 4. Depending on the potential to which the lines 31 to 46 are connected, the lines 31, 33, 35, 42, 44 and 46, for example, with the associated bars 31a, 33a, 35a, 42a, 44a and 46a have a minimum parasitic capacitance with respect to the semiconductor substrate, which is arranged below the metallization plane 3. The potentials may also be chosen such that the lines 32, 34, 36, 41, 43 and 45 with the associated bars 32a to 45a have a minimum parasitic capacitance with respect to the semiconductor substrate.

Figure 6:
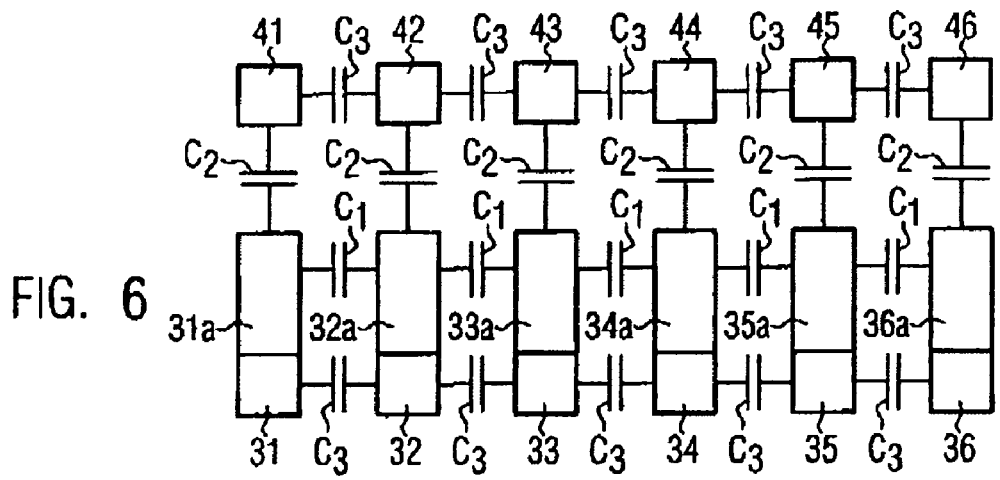
FIG. 6 shows a first sectional illustration of the second exemplary embodiment shown in FIG. 5.
Figure 7:
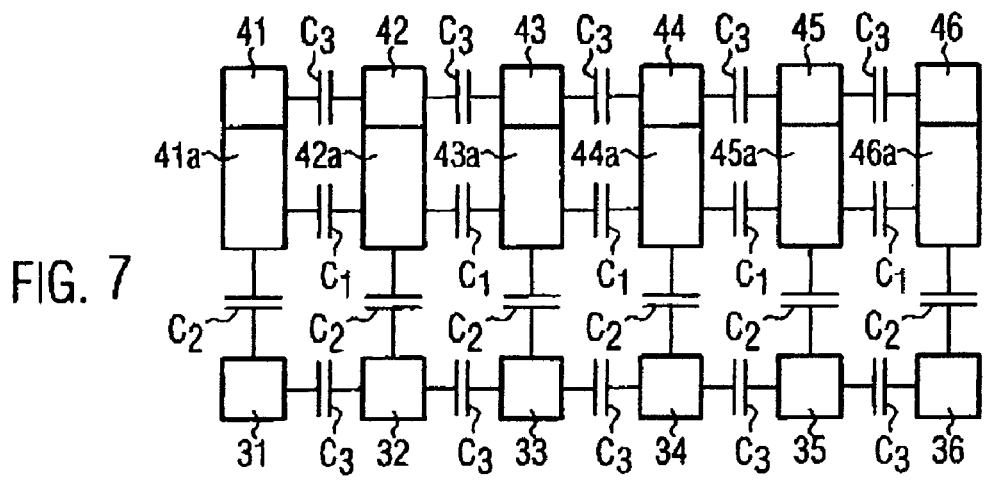
FIG. 7 shows a second sectional illustration of the second exemplary embodiment shown in FIG. 5.

FIG. 6 shows a cross sectional illustration of the second exemplary embodiment of the capacitance structure shown in FIG. 5 along the sectional line EE. As already explained with reference to FIG. 5, adjacent lines in the metallization planes 3 and 4 are at different potentials. As a result, adjacent bars 31a to 36a and 41a to 46a, which are in the form of vias, are also at different potentials, which means that four capacitance components are produced as contributions to the total useful capacitance of the capacitance structure. First capacitance components $C_1$ are produced by the opposing surfaces of the side regions between the bars 31a to 36a. Similarly, these components $C_1$ are produced by the opposing surfaces of the side regions between the bars 41a to 46a, as shown in FIG. 7, which show a sectional illustration of the capacitance structure shown in FIG. 5 along the sectional line DD. Second capacitance components $C_2$ are formed between the opposing face regions of the bars 31a to 36a and the face regions of the lines 41 to 46 (FIG. 6). Equally, these components $C_2$ are also formed by the opposing face regions of the bars 41a to 46a and the face regions of the lines 31 to 36 (FIG. 7). Third capacitance components $C_3$ are respectively formed by the face regions of the lines 31 to 36 and 41 to 46, which face regions are adjacent in a metallization plane 3 and 4 (FIGS. 6 and 7).

Figure 8:
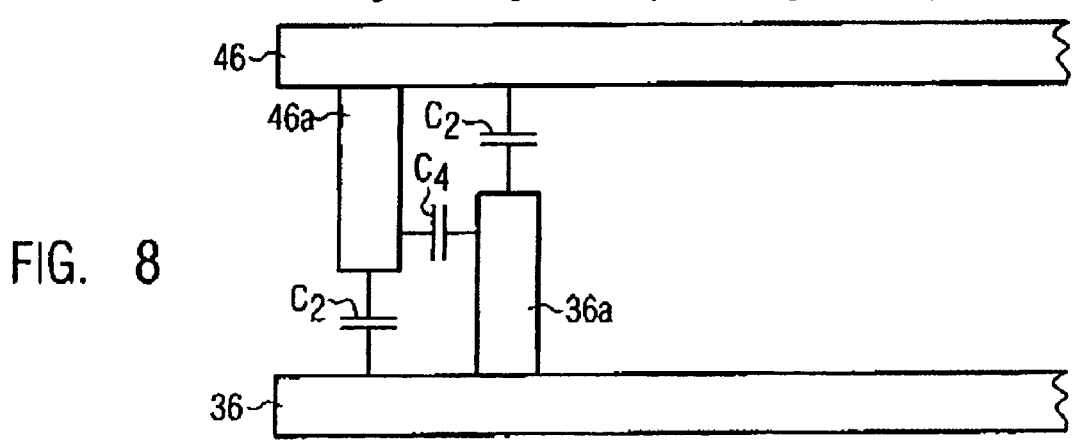
FIG. 8 shows a third sectional illustration of the second exemplary embodiment shown in FIG. 5.

As FIG. 8 shows with reference to a sectional illustration of the capacitance structure K shown in FIG. 5 along the sectional line GG, fourth capacitance components $C_4$ are formed by the opposing face regions of the bars 31a to 36a on the first metallization plane 3 in relation to the bars 41a to 46a on the second metallization plane 4, for example of the bars 36a and 46a (FIG. 8).

Figure 9:
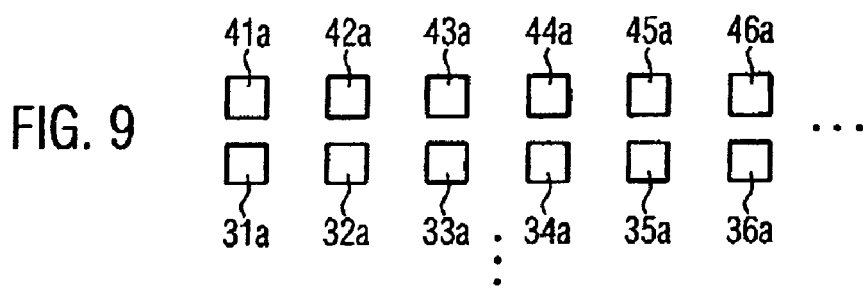
FIG. 9 shows a fourth sectional illustration of the second exemplary embodiment shown in FIG. 5.

FIG. 9 shows a sectional illustration along the sectional line FF shown in FIG. 5. The symmetrical arrangement of the bars 31a to 46a can be seen. As FIG. 9 indicates, the number of bars can be extended in both directions, and hence also the number of lines 31 to 46 (FIGS. 5 to 8) is not limited to the number illustrated in the exemplary embodiment.

Figure 10:
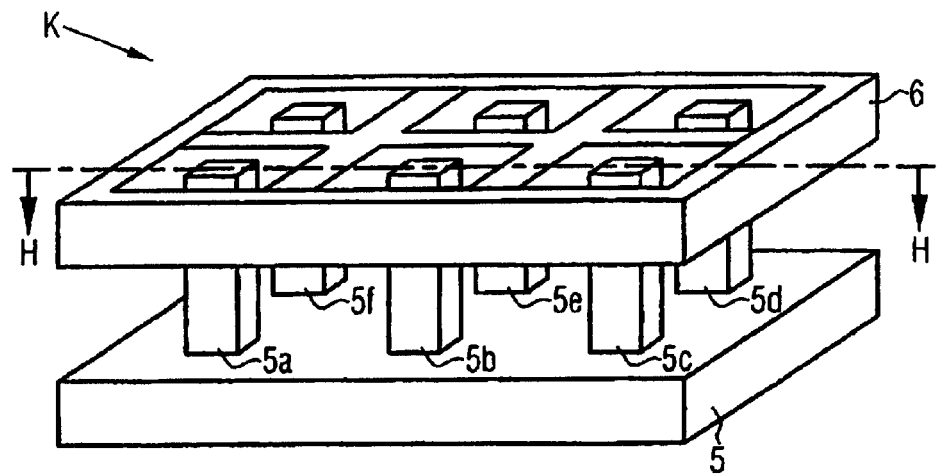
FIG. 10 shows a perspective illustration of a third exemplary embodiment of the inventive semiconductor component.

A further exemplary embodiment is shown in a perspective view in FIG. 10. The capacitance structure K has a first metallization plane 5, which is in the form of a cohesive, full plate and is formed in an insulating layer or an insulating layer system (not shown). This insulating layer is formed on a semiconductor substrate (not shown). A second metallization plane 6 in the form of a lattice is formed parallel to the first metallization plane 5 at a distance therefrom. The first metallization plane 5 has homogeneous electrically conductive vias 5a to 5f arranged on it which are in bar form and project at least partially into the cutouts in the lattice-like second metallization plane 6.

Figure 11:
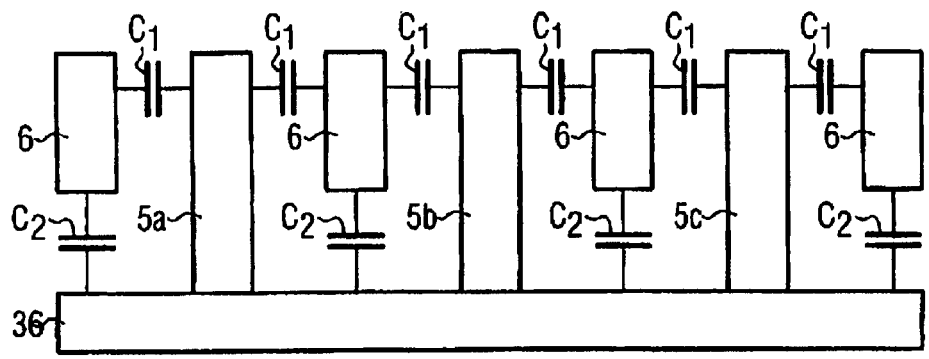
FIG. 11 shows a first sectional illustration of the third exemplary embodiment shown in FIG. 10.

FIG. 11 uses a cross section along the sectional line HH in FIG. 10 to show which capacitance components $C_1$ and $C_2$ are produced and contribute to the useful capacitance of the capacitance structure. First capacitance components $C_1$ are formed by the opposing face regions of the vias 5a to 5c with the lattice structure of the metallization plane 6. Second capacitance components $C_2$ are formed between the opposing face regions of the metallization plane 6, which is in lattice form, and the metallization plane 5. The lattice-like metallization plane 6 has a minimum parasitic capacitance with respect to the semiconductor substrate, which is formed below the first metallization plane 5. In this embodiment however, it does not matter which of the two metallization planes 5 or 6 delivers a minimum parasitic capacitance component, but rather what matters is that the sum of the parasitic capacitance components produced by the metallization planes 5 and 6 with respect to the semiconductor substrate is at a minimum. This means that this embodiment can also be in a form such that the lattice-like metallization plane 6 represents the bottom electrode of the capacitance structure, and hence is closer to the semiconductor substrate than the metallization plane 5.

Figure 12:
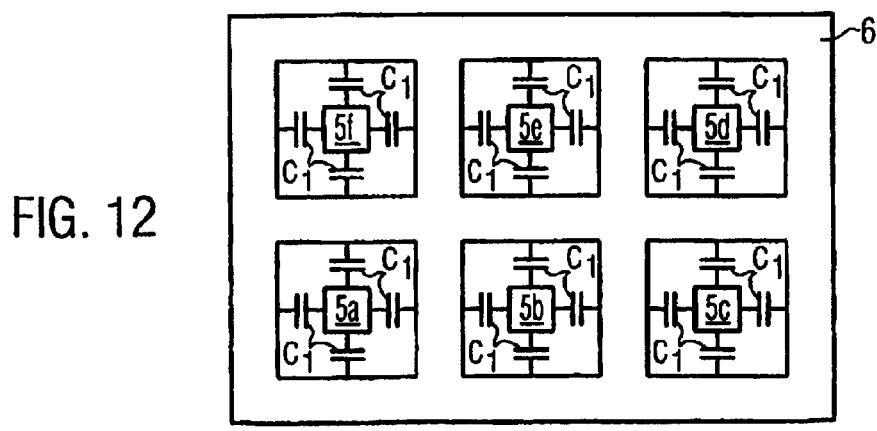
FIG. 12 shows a second sectional illustration of the third exemplary embodiment shown in FIG. 10.

FIG. 12 shows a plan view of the capacitance structure K shown in FIG. 10. The vias 5a to 5j respectively project into one of the cutouts in the metallization plane 6 and are at almost the same distance from the edges of these cutouts. As FIG. 12 shows, a capacitance component $C_1$ is respectively formed between each of the four opposing face regions. Provision may also be made for the cutouts in the lattice 6 to be in round or oval form and for the vias 5a to 5f to be produced with a round or oval cross section.

Figure 13:
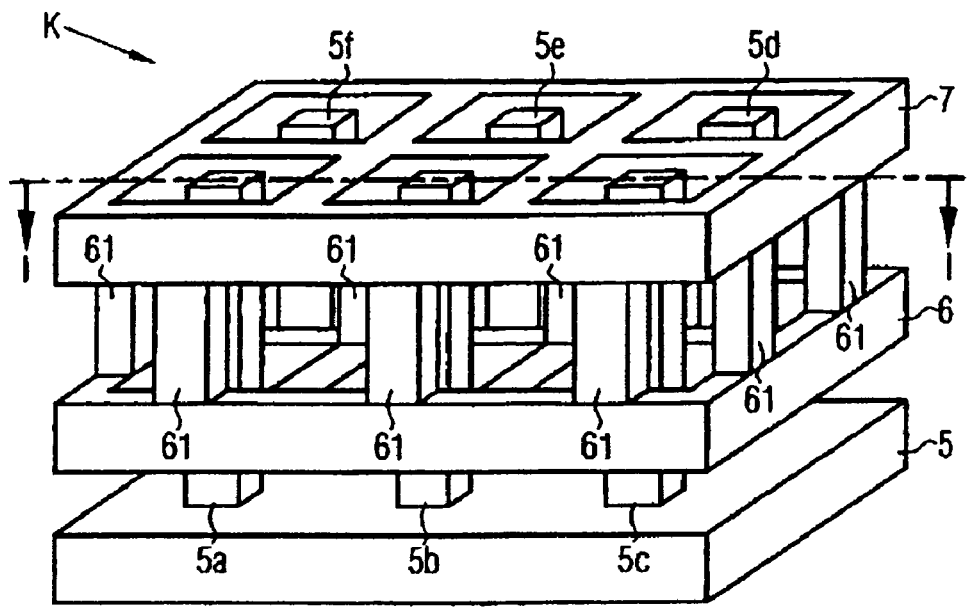
FIG. 13 shows a perspective illustration of a fourth exemplary embodiment of the inventive semiconductor component.

An exemplary embodiment which represents a development of the preceding example is shown in FIG. 13. In addition to the metallization planes 5 and 6, this capacitance structure K has a third metallization plane 7, which is likewise in lattice form and is arranged parallel and congruently with respect to the metallization plane 6. The metallization planes 6 and 7 are connected to one another by electrical connections 61. In this exemplary embodiment, the bar-like electrically conductive regions 5a to 5j project through the cutouts in the lattice-like metallization plane 6 and extend at least partially into the cutouts in the lattice-like metallization plane 7.

Figure 14:
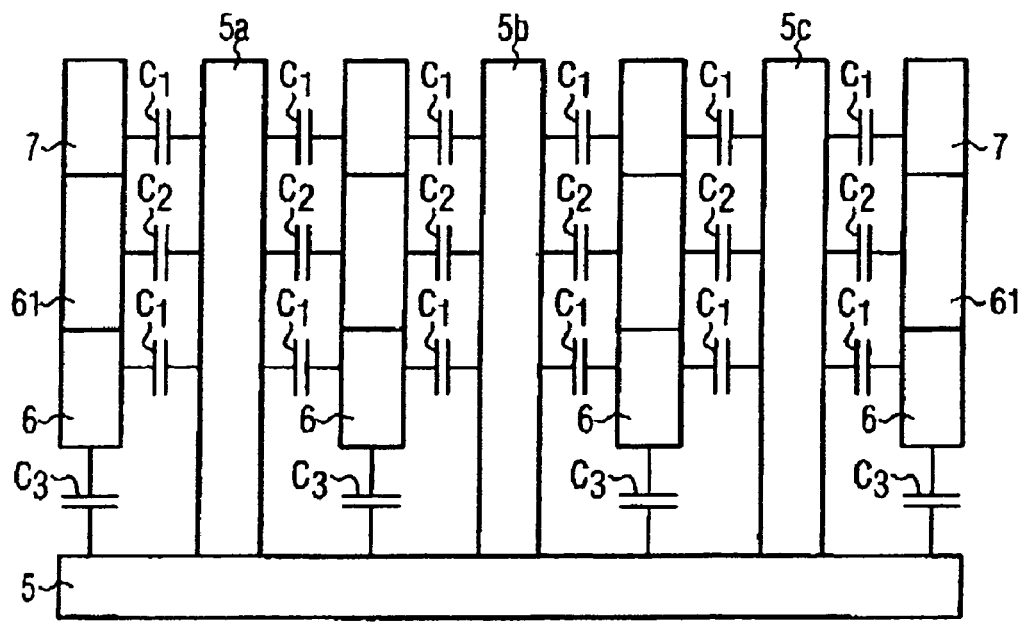
FIG. 14 shows a sectional illustration of the fourth exemplary embodiment shown in FIG. 13.

In the cross sectional illustration in FIG. 14, which shows the capacitance structure K shown in FIG. 13 along the sectional line II, it can be seen which capacitance components $C_1$, $C_2$ and $C_3$ are delivered as contributions to the useful capacitance of the capacitance structure K. First capacitance components $C_1$ are formed between the opposing face regions of the bars 5a to 5c and the lattice-like metallization planes 6 and 7. Second capacitance components $C_2$ are produced between the opposing face regions of the bars 5a to 5c and the electrical connections 61. In addition, third capacitance components $C_3$ are produced between the opposing face regions of the metallization plane 5 and of the lattice-like metallization plane 6.

The homogeneous via bars in the exemplary embodiments are formed from the materials used in the known processes, for example tungsten or copper.

In all of the exemplary embodiments, a capacitance structure K can be fabricated which can be produced with relatively little complexity and which produces a relatively large capacitance surface (which improves the ratio of useful capacitance to parasitic capacitance) given virtually unchanged surface area requirement for the capacitance structure on the chip surface. The capacitance density of the capacitance structure can be increased particularly by the homogeneous—that is to say free from intermediate metallization regions, which are formed by patterning the metallization planes, for example—via bars.

The invention is not limited to the capacitance structures K illustrated in the exemplary embodiments. The capacitance structure K can be produced in a wide variety of ways. First, by way of example, a capacitance structure K may have a first metallization plane corresponding to the metallization plane 6 (FIGS. 10 and 13) and a second metallization plane corresponding to the metallization plane 3 (FIG. 5), on which correspondingly produced electrically conductive regions are arranged. Provision may also be made for a capacitance structure to have two lattice-like metallization planes corresponding to the metallization plane 6 (FIGS. 10 and 13), which are arranged offset from one another such that the crossing points of the lattice structure of one metallization plane are vertically below the cutouts in the second lattice-like metallization plane. Both lattice-like metallization planes have electrically conductive regions which are in bar form, for example, and which are respectively arranged at the crossing points of the lattice structures of the metallization planes and extend into the cutouts in the opposing lattice-like metallization plane.

The invention claimed is:

1. A semiconductor component comprising:
an insulating layer disposed on a semiconductor substrate; and
a capacitance structure formed in the insulating layer, the structure having two capacitance surface parts,
the first capacitance surface part having at least a first metallization plane and a second metallization plane extending approximately parallel to the substrate surface and are each operatively connected to one of two electrodes, and
the second capacitance surface part having at least one electrically conductive region between the first metallization plane and the second metallization plane in the insulating layer and is operatively connected to one of the first metallization plane and the second metallization plane where the second capacitance part is in the form of a homogeneous cohesive elevation, wherein the elevation comprises a top wall and side walls, wherein the top wall is oriented perpendicular to the side walls and wherein the side walls and the top wall are in direct contact with by the insulating layer.

2. The semiconductor component of claim 1, where the electrically conductive region of the second capacitance part is produced with a Damascene process.

3. The semiconductor component of claim 1, where the electrically conductive region of the second capacitance part is arranged at about a right angle to the first metallization plane and the second metallization plane.

4. The semiconductor component of claim 1, where the electrically conductive region is divided into at least two parts, a first conductive region and a second conductive region and the first conductive region is operatively connected to the first metallization plane and the second conductive region is operatively connected to the second metallization plane.

5. The semiconductor component of claim 4, where the metallization planes are in the form of a cohesive plate.

6. The semiconductor component of claim 4, where the first conductive region further comprises a first plurality of conductive bar forms and the second conductive region further comprises a second plurality of conductive bar forms.

7. The semiconductor component of claim 6, where the first plurality of bar forms are arranged at a fixed distance from one another on the first metallization plane and extend in the direction of the second metallization plane, and the second plurality of bar forms are arranged at a fixed distance from one another on the second metallization plane and extend in the direction of the first metallization plane.

8. The semiconductor component of claim 7, where the first plurality of bar forms has a first length and the second plurality of bar forms has a second length and the first length is greater than, less than or the same length as the second length and the sum of the first length and the second length is greater than a distance between the first metallization plane and the second metallization plane.

9. The semiconductor component of claim 1, where at least one of the first metallization plane and the second metallization plane is each comprised of at least two electrical lines in parallel to one another and the electrical lines of the first metallization plane are arranged congruently with respect to the electrical lines of the second metallization plane.

10. The semiconductor component of claim 9, where the electrically conductive region is divided into at least two parts, a first conductive region and a second conductive region, and the first conductive region is operatively arranged on the electrical lines of the first metallization plane and the second conductive region is operatively arranged on the electrical lines of the second metallization plane.

11. The semiconductor component of claim 10, where the first conductive region further comprises a first plurality of conductive bar forms and the second conductive region further comprises a second plurality of conductive bar forms.

12. The semiconductor component of claim 11, where the first plurality of bar forms are arranged at a fixed distance from one another on the electrical lines of the first metallization plane and extend in the direction of the second metallization plane, and the second plurality of bar forms are arranged at a fixed distance from one another on the electrical lines of the second metallization plane and are offset from the bars of the first conductive region and extend between the bars of the first conductive region in the direction of the first metallization plane.

13. The semiconductor component of claim 12, where the first plurality of bar forms has a first length and the second plurality of bar forms has a second length and the first length is greater than, less than or the same length as the second length and the sum of the first length and the second length is greater than a distance between the first metallization plane and the second metallization plane.

14. The semiconductor component of claim 1, where the first metallization plane is in the form of a cohesive plate and the second metallization plane is a lattice.

15. The semiconductor component of claim 14, where the electrically conductive region is operatively attached to the first metallization plane and further comprises a plurality of bar forms extending in the direction of the second metallization plane and at least one bar of the plurality of bars projects at least partially into a cutout in the lattice.

16. The semiconductor component of claim 14, further comprising a third metallization plane in a form of a lattice and arranged parallel to and at a distance from the second metallization plane and the second and third metallization planes are electrically connected to one another.

17. The semiconductor component of claim 16, where at least one of a plurality of bar forms project through the cut-out in the second metallization plane and extend at least partially into a cut-out in the third metallization plane.

18. A method for fabricating a semiconductor component comprising:
disposing an insulator layer on a semiconductor substrate;
forming a first capacitance part in the insulating layer having at least a first metallization plane and a second metallization plane which are formed essentially parallel to the substrate surface; and
forming a second capacitance part that is an electrically conductive region that is homogeneous in the insulating layer between the metallization planes, where the electrically conducting region is operatively connected to one of the metallization planes, where the second capacitance part is in the form of a homogeneous cohesive elevation, wherein the elevation comprises a top wall and side walls, wherein the top wall is oriented perpendicular to the side walls and wherein the side walls and the top wall are in direct contact with the insulating layer.

19. The method of claim 18, further comprising forming the electrically conductive region in a homogeneous cohesive elevation, the region being formed between at least two metallization planes is formed by patterning the metallization plane.

20. The method of claim 19, further comprising forming the electrically conductive region in the insulating material as a via structure.

21. The method of claim 20, where the via structure arranges the electrically conductive region at essentially a right angle to the metallization planes.

22. The method of claim 19, where the via structures form bars that are operatively connected to the first metallization plane extending towards the second metallization plane.

23. The method of claim 18, further comprising forming the first metallization plane and the second metallization plane as a cohesive plate.

24. The method of claim 18, further comprising forming the first metallization plane as at least two electrical lines arranged in parallel to one another and the second metallization plane as at least two electrical lines parallel to one another and the electrical lines of the first metallization plane are congruently arranged with respect to the electrical lines of the second metallization plane.

25. The method of claim 18, further comprising forming the first metallization plane as a cohesive plate and the second metallization plane as a lattice plate.

26. The method of claim 25, further comprising forming a third metallization plane formed as a lattice.

27. The method of claim 26, further comprising forming a via arrangement that forms a bar extending from the first metallization plane through a cutout of the second metallization plane and extending into a cutout in the third metallization plane.

28. A semiconductor component comprising:
an insulating layer disposed on a semiconductor substrate; and
a capacitance structure formed in the insulating layer,
a first metallization plane and a second metallization plane, said first and second metallization planes extending approximately parallel to the substrate surface, wherein the capacitance structure comprises at least one electrically conducting element in the first metallization plane and at least one electrically conducting element in the second metallization plane, and at least one electrically conductive region between the first metallization plane and the second metallization plane in the insulating layer, the electrically conductive region being connected to one of the electrically conducting elements, and the electrically conductive region being in the form of a homogeneous cohesive elevation wherein the elevation comprises a top wall and side walls, wherein the top wall is oriented perpendicular to the side walls and wherein the side walls and the top wall are in direct contact with the insulating layer.

29. A semiconductor component comprising:
an insulating layer disposed on a semiconductor substrate; and
a capacitance structure formed in the insulating layer, the structure having two capacitance surface parts, the first capacitance surface part having at least a first metallization plane and a second metallization plane extending approximately parallel to the substrate surface and are each operatively connected to one of two electrodes, and the second capacitance surface part having at least one electrically conductive region between the first metallization plane and the second metallization plane in the insulating layer and is operatively connected to one of the first metallization plane and the second metallization plane where the second capacitance part is in the form of a homogeneous cohesive elevation, wherein the elevation comprises a top wall and side walls, wherein the top wall is oriented perpendicular to the side walls and wherein the side walls are surrounded by the insulating layer and wherein the insulating layer is in between the top wall and the one of the first metallization plane and the second metallization plane that is not connected to the electrically conductive region of the second capacitance part.

* * * * *